US010693419B2

(12) United States Patent
Sloushch et al.

(10) Patent No.: US 10,693,419 B2
(45) Date of Patent: Jun. 23, 2020

(54) REDUCTION OF POWER CONSUMPTION IN INTEGRAL ULTRA-WIDEBAND POWER AMPLIFIERS

(71) Applicant: Elbit Systems Land and C4I Ltd., Netanya (IL)

(72) Inventors: Anatoly Sloushch, Netanya (IL); Yitzhak Botvin, Netanya (IL); Ezra Zamir, Netanya (IL)

(73) Assignee: Elbit Systems Land and C4I Ltd., Netanya (IL)

( * ) Notice: Subject to any disclaimer, the term of this patent is extended or adjusted under 35 U.S.C. 154(b) by 0 days.

(21) Appl. No.: 15/772,064

(22) PCT Filed: Jul. 26, 2017

(86) PCT No.: PCT/IL2017/050835
§ 371 (c)(1),
(2) Date: Apr. 29, 2018

(87) PCT Pub. No.: WO2018/020499
PCT Pub. Date: Feb. 1, 2018

(65) Prior Publication Data
US 2019/0140593 A1    May 9, 2019

(30) Foreign Application Priority Data

Jul. 27, 2016  (IL) .......................... 246991

(51) Int. Cl.
*H03F 3/191*    (2006.01)
*H03F 1/02*    (2006.01)
(Continued)

(52) U.S. Cl.
CPC ............ *H03F 1/0211* (2013.01); *H03F 1/02* (2013.01); *H03F 3/189* (2013.01); *H03F 3/195* (2013.01);
(Continued)

(58) Field of Classification Search
CPC ........ H03F 1/0211; H03F 3/213; H03F 3/195; H03F 3/211; H03F 3/189; H03F 1/02;
(Continued)

(56) References Cited

U.S. PATENT DOCUMENTS 6,603,818 B1 *  8/2003  Dress, Jr. ............. H04B 1/7172
                                                                  375/295
7,242,707 B1    7/2007  Miao
(Continued)

FOREIGN PATENT DOCUMENTS

CN    101262287    9/2008
CN    101425810    5/2009
(Continued)

OTHER PUBLICATIONS

An Ultrawideband CMOS Low-Noise Amplifier for 3.1-10.6-GHz A Wireless Receivers, Andrea Bevilacqua et al., IEEE Journal of Solid State Circuits, vol. 39, No. 12, Dec. 2004, pp. 2259-2268.
(Continued)

*Primary Examiner* — Khanh V Nguyen
(74) *Attorney, Agent, or Firm* — Pearl Cohen Zedek Latzer Baratz LLP

(57) ABSTRACT

Power amplification units and methods are provided, which use a combiner and an auxiliary signal to feed the power amplifier (PA) with a signal that prevents or reduces operation of higher amplification stages during off periods of the received RF signal. The PA output is delivered through an output matching circuit configured to pass the RF signal and attenuate the auxiliary signal; and the combiner combines the RF signal and the auxiliary signal through respective filters to generate the RF input signal to the PA. An auxiliary signal generator may be configured to generate the auxiliary signal with relation to the RF signal as having a frequency spectrum lower than a cutoff RF frequency. Resulting lower
(Continued)

power consumption, particularly in case of low duty cycle RF signals, reduces heating, enables longer battery use and increases reliability performance.

20 Claims, 3 Drawing Sheets

(51) Int. Cl.
    *H04B 1/00* (2006.01)
    *H03F 3/21* (2006.01)
    *H03F 3/189* (2006.01)
    *H03F 3/195* (2006.01)
    *H03F 3/213* (2006.01)
    *H03F 3/60* (2006.01)

(52) U.S. Cl.
    CPC ............ *H03F 3/211* (2013.01); *H03F 3/213* (2013.01); *H04B 1/00* (2013.01); *H03F 3/602* (2013.01); *H03F 2200/102* (2013.01); *H03F 2200/165* (2013.01); *H03F 2200/231* (2013.01); *H03F 2200/387* (2013.01); *H03F 2200/451* (2013.01)

(58) Field of Classification Search
    CPC ......... H03F 2200/387; H03F 2200/231; H03F 2200/165; H03F 2200/451; H03F 2200/102; H04B 1/00
    USPC .................. 330/53, 54, 124 R, 286, 295, 302
    See application file for complete search history.

(56) References Cited

U.S. PATENT DOCUMENTS

| | | | |
|---|---|---|---|
| 8,706,062 | B1 | 4/2014 | Yu et al. |
| 2003/0011433 | A1 | 1/2003 | Richley |
| 2004/0087291 | A1 | 5/2004 | Wada |
| 2005/0031016 | A1 | 2/2005 | Rosen |
| 2005/0100076 | A1* | 5/2005 | Gazdzinski ........ H04B 1/7176 375/130 |
| 2005/0113151 | A1 | 5/2005 | Burke et al. |
| 2006/0039449 | A1 | 2/2006 | Fontana et al. |
| 2007/0082648 | A1 | 4/2007 | Gallagher |
| 2007/0109099 | A1 | 5/2007 | Raphaeli et al. |
| 2008/0024214 | A1 | 1/2008 | Kim |
| 2008/0056419 | A1 | 3/2008 | Lee et al. |
| 2010/0177803 | A1 | 7/2010 | Raphaeli et al. |
| 2010/0195699 | A1 | 8/2010 | Liu |
| 2010/0220774 | A1 | 9/2010 | Park et al. |
| 2010/0226411 | A1 | 9/2010 | Watanabe et al. |
| 2010/0278214 | A1 | 11/2010 | Westcott et al. |
| 2011/0255634 | A1 | 10/2011 | Utagawa et al. |
| 2013/0243043 | A1 | 9/2013 | Rhee et al. |
| 2014/0347133 | A1* | 11/2014 | Qureshi .................. H03F 3/193 330/295 |

FOREIGN PATENT DOCUMENTS

| | | |
|---|---|---|
| CN | 101777929 | 7/2010 |
| CN | 101834627 | 9/2010 |
| CN | 101924574 | 12/2010 |
| CN | 102098064 | 6/2011 |
| CN | 102111209 | 6/2011 |
| CN | 102291163 | 12/2011 |
| CN | 102891691 | 1/2013 |
| CN | 102931984 | 2/2013 |
| CN | 103036590 | 4/2013 |
| CN | 103138743 | 6/2013 |
| CN | 103259522 | 8/2013 |
| CN | 203367465 | 12/2013 |
| CN | 105490762 | 4/2016 |
| DE | 102014219925 | 4/2016 |
| WO | WO 15103692 | 7/2015 |

OTHER PUBLICATIONS

International Search Report of PCT Application No. PCT/IL2017/050835, dated Oct. 22, 2017.

Supplementary European Search Report for European Patent Application No. 17833702.8, dated Sep. 25, 2018.

* cited by examiner

REDUCTION OF POWER CONSUMPTION IN INTEGRAL ULTRA-WIDEBAND POWER AMPLIFIERS

CROSS-REFERENCE TO RELATED APPLICATIONS

This application is a National Phase Application of PCT International Application No. PCT/IL2017/050835, International Filing Date Jul. 26, 2017, entitled "REDUCTION OF POWER CONSUMPTION IN INTEGRAL ULTRA-WIDEBAND POWER AMPLIFIERS", published on Feb. 1, 2018 under Publication No. WO 2018/020499. This application also claims the priority of Israel Patent Application No. 246991, filed Jul. 27, 2016 which is hereby incorporated by reference in its entirety.

BACKGROUND OF THE INVENTION

1. Technical Field

The present invention relates to the field of power amplifiers, and more particularly, to reducing power consumption in integral ultra-wideband power amplifiers.

2. Discussion of Related Art

Low power consumption is important for mobile operation such as communication and radar equipment. These types of equipment may be operated in a wideband frequency range, for which multi octave Power Amplifiers are often used. The power consumption of the Power Amplifier (PA) is usually a major part of the total power consumption. Ultra-Wideband (multi octave) PA has a low power added efficiency (PAE). Generally, distributed amplifier architectures are used for this type of amplifiers. For RF (radiofrequency) pulses operation with duty cycle less than 50%, the power consumption of the amplifier during the quiet time slots between the pulses still continues, although no RF power exists at the amplifier input. Conventional methods for reducing power consumption during the quiet slots between pulses are based on PA bias voltage control (via gate and drain amplifier ports). For example, U.S. Patent Publication Nos. 2003011433, 2006039449, 2010220774 and 2010226411, as well as Chinese Patent Publication Nos. 102098064 and 102891691 which are incorporated herein by reference in their entirety, disclose various ways of reducing the power consumption of power amplifiers.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a power amplification unit comprising an integral ultra-wideband (UWB) power amplifier (PA) having a RF (radio frequency) input for receiving a RF input signal, a PA output for providing an amplified output, the UWB PA operated by control and power supply voltages; a combiner configured to receive a RF signal and an auxiliary signal and to generate therefrom, the RF input signal to the UWB PA; a signal generator configured to generate the auxiliary signal to have a pulse-shaped component derived from the RF signal and a quiet period component, the auxiliary signal having a frequency spectrum lower than a cutoff RF frequency; and an output matching circuit connected to the PA output and having signal filtering parameters selected to pass the amplified output above the cutoff RF frequency which is lower than a frequency of the RF signal.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
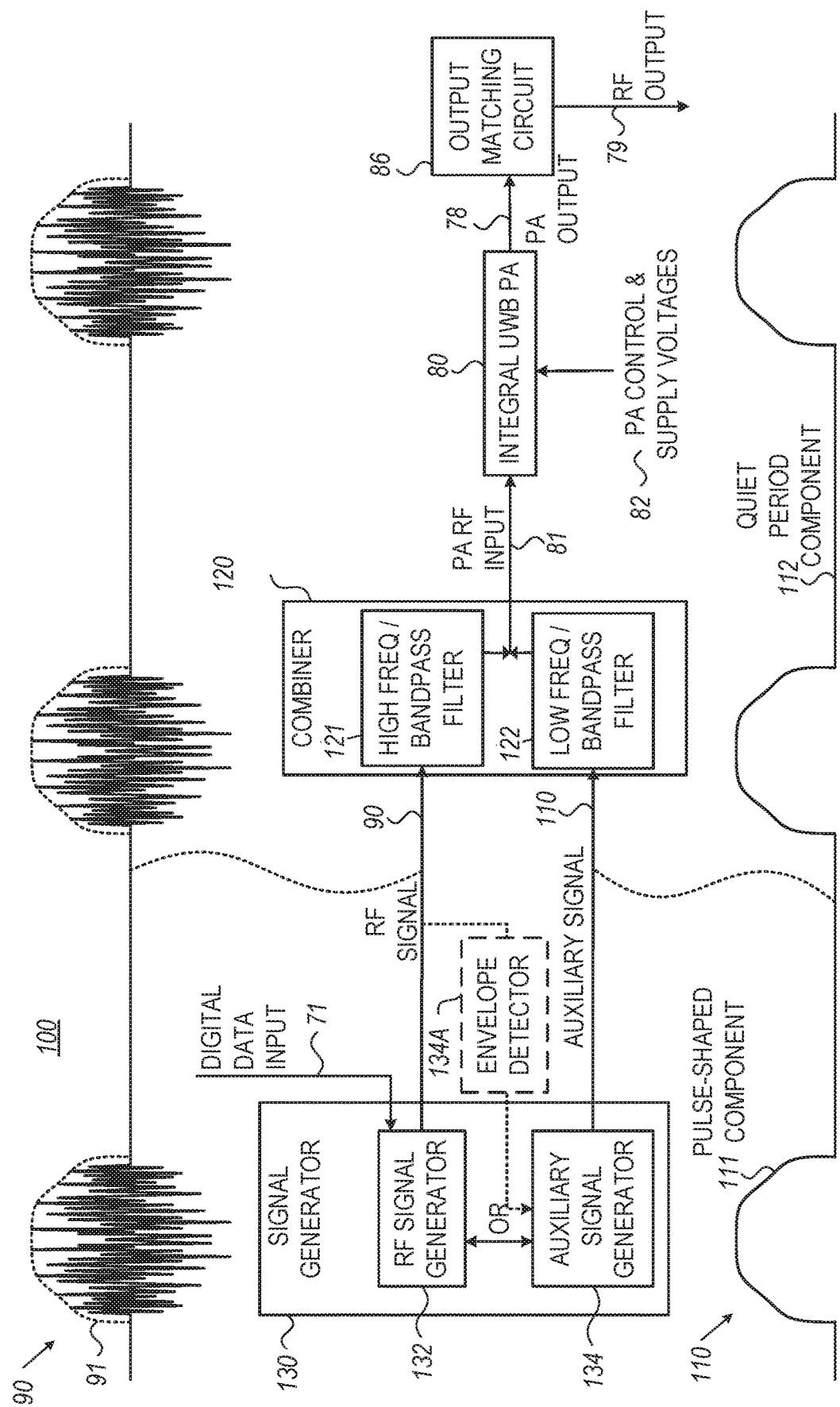
FIG. 1 is a high level schematic block diagram of a power amplification unit, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. Any of the disclosed modules or units may be at least partially implemented by a computer processor.

In the prior art, the implementation of fast bias control (duration less than 100 ns) is very difficult and power consuming due to high capacitance of the bias circuits. For cases in which very short RF pulses are used (e.g., ultra-wideband waveform, where pulse duration is less than 5 ns and duty cycle less than 50%), the mentioned conventional methods of power reduction can't be used. Embodiments of the present invention provide efficient and economical method and mechanism for operating ultra-wideband PA's, particularly with RF signals having a low duty cycle (less than 50%).

Power amplification units and methods are provided, which use a combiner and an auxiliary signal to feed the power amplifier (PA) with a signal that prevents or reduces operation of higher amplification stages during off periods of the received RF signal. The disclosed invention provides ultra-wideband (UWB) power amplifiers (PA) for use e.g., in communications, in radars and radar imaging systems, etc.

The combiner combines the RF signal and the auxiliary signal through respective filters to generate the RF input signal to the PA and an output matching circuit is connected to the PA output and has signal filtering parameters selected to pass the amplified output above a cutoff RF frequency which is lower than a frequency of the RF signal. An auxiliary signal generator may be configured to generate the auxiliary signal with relation to the RF signal as having a frequency spectrum lower than the cutoff RF frequency. Resulting lower power consumption, particularly in case of low duty cycle RF signals, reduces heating, enables longer battery use and increases reliability performance.

FIG. 1 is a high level schematic block diagram of a power amplification unit 100, according to some embodiments of the invention. Power amplification unit 100 comprises an ultra-wideband (UWB) power amplifier (PA) 80 with control and supply voltages 82 and having a PA RF (radio frequency) input 81 for receiving an RF input signal. UWB PA 80 may comprise an integral UWB PA, a multi-octave PA (MOPA), a monolithic microwaves integrated circuit (MMIC) PA etc. PA 80 is controlled by PA control and supply voltages 82 ensuring PA DC (direct current) bias.

Power amplification unit 100 further comprises a combiner 120 (e.g., a duplexer, a multiplexer or any other unit for combining signals) configured to receive a RF signal 90 and an auxiliary signal 110 and to generate therefrom the RF input signal (81) to PA 80. Combiner 120 may comprise no, one two or more filters; optionally filters may be connected at one or more inputs to the combiner. In a non-limiting example, combiner 120 may comprise a high pass filter (HPF) 121 and a low pass filter (LPF) 122 configured to pass RF signal 90 and auxiliary signal 110, respectively, preventing interference and mutual disturbances between RF signal 90 and auxiliary signal 110. Alternatively or complementarily, combiner 120 may comprise two or more bandpass filters at respective frequency ranges. Auxiliary signal 110 comprises a signal at a lower frequency than RF signal 90, generally having its spectrum width according to the PRF (pulse repetition frequency), e.g., up to $1/\tau$, where $\tau$ is the pulse duration of RF signal 90. One or more filters 121, 122 may be part of combiner 120 or be set at one or more inputs to combiner 120. Auxiliary signal 110 is configured to significantly reduce or prevent amplification and power consumption by PA 80 during periods between pulses of RF signal 90.

Power amplification unit 100 further comprises an output matching circuit 86 connected to a PA output 78 of PA 80 and having signal filtering parameters selected to pass the amplified output above a cutoff RF frequency which is lower than a frequency of RF signal 90. Output matching circuit 86 may be configured to receive and pass with minimum loss only (or mainly) the amplified output from PA 80 and attenuate auxiliary signal 110. For example, output matching circuit 86 may comprise LC components (capacitor(s) and/or coil(s)) such as an RF choke coil (L), a DC block, capacitors (C), etc.

Power amplification unit 100 further comprises signal generator 130 having for example an RF signal generator 132 configured to generate RF signal 90, e.g., from digital data input 71, and an auxiliary signal generator 134 configured to generate auxiliary signal 110 to have a pulse-shaped component 111 derived from RF signal 90 (e.g., an envelope or a modified envelope thereof) and a quiet period component 112 (e.g., a DC level in a non-limiting manner) selected to be attenuated or removed by output matching circuit 86. In certain embodiments, auxiliary signal generator 134 may be in communication with RF generator 132, be integrated therein and/or receive same digital data input 71 and signal generator 130 may be configured to generate both RF signal 90 and auxiliary signal 110 simultaneously to maintain synchronicity between them and avoid delay.

Alternatively or complementarily, auxiliary signal generator 134 may be configured to receive RF signal 90 and generate pulse-shaped component 111 of auxiliary signal 110 as an envelope of RF signal 90 and/or as a modified envelope of RF signal 90, based on its envelope, and further comprising adjustments of various envelope features (e.g., start, end, shape, etc.) to prevent or reduce high frequency components of auxiliary signal 110. Pulse-shaped component 111 may be optimized for spectrum mask quality and Error Vector Magnitude (EVM) quality of the amplified output with respect to a PA power consumption.

In certain embodiments, auxiliary signal generator 134 may comprise an envelope detector 134A configured to detect an envelope 91 of RF signal 90 and generate corresponding pulse-shaped component 111 of auxiliary signal 110 therefrom. Alternatively or complementarily, the shape of envelope 91 may be selected to avoid changing RF signal 90 as well as to avoid introduction of noise upon changes from quiet period component 112 (e.g., a DC or other low frequency signal) to pulse-shaped component 111. The configuration of combiner 120 with filters 121, 122 may be designed to prevent interaction between RF signal 90 and auxiliary signal 110.

UWB PA 80 (e.g., an integral UWB PA) may be configured to amplify RF pulsed signal 91. Output matching circuit 86 may be configured to pass with minimum loss only RF signal 90 from UWB PA 80 and to reduce significantly auxiliary signal 110 and prevent it from loading the amplification stages of UWB PA 80.

The cutoff RF frequency of output matching circuit 86 may be selected to pass RF signal 90 and attenuate auxiliary signal components such as pulse-shaped component 111 and quiet period component 112. For example, the cutoff RF frequency may be set according to any specifications of PA 80, RF signal 90 and auxiliary signal 110, e.g., anywhere between 300 MHz and 2 GHz, 3 GHz or beyond. For example, in a non-limiting case, if the 1/τ is around 500 MHz (corresponding to a pulse duration of 2 ns) and RF signal 90 is at 4 GHz, the cutoff RF frequency may be set between theses frequencies. For example, output matching circuit 86 may comprise a high-pass filter at 3 GHz (e.g., a corresponding passive LC circuit) to minimize loss to the RF signal while attenuating the auxiliary signal. It is noted that PA 80 should be selected to operate in both frequency ranges, that of RF signal 90 and auxiliary signal 110, and may be implemented, e.g., as a multi-octave PA.

In certain embodiments, combiner 120 may be configured to offset RF signal 90 by adding a DC level to it (as quiet period components 112 of auxiliary signal 110), which is selected according to levels of the PA control and supply voltages 82. The signal filtering parameters of output matching circuit 86 ensure a low gain of late amplification stages of PA 80 for the auxiliary signal 110.

Power amplification unit 100 may thus be configured to provide a significant reduction of power consumption by an off-the-shelf integral PA, not requiring performing any internal modifications of the PA (e.g., PA 80 may be operated without changing control voltages 82). Combiner 120 and auxiliary signal 110 are configured to reduce PA power consumption when idle (i.e., no RF amplification needed), by shifting the PA's internal working point to a non-amplifying state (inactive final amplification stage(s) of the PA) due to the parameters of auxiliary signal 110. During active periods (RF amplification), auxiliary signal 110 is configured to shift the PA's internal working point for amplification of the RF signal 90 (when the PA is open).

Quiet period component 112 (e.g., a DC level) of auxiliary signal 110 may be selected according to levels of the PA control and supply voltages 82 to set the PA's internal working point in the non-amplification state (when the PA is closed) to a point that reduces a power consumption of PA 80 with respect to a power consumption thereof when receiving a zero RF input signal.

In certain embodiments, power amplification unit 100 may thus be configured to be switchable into an operation mode of direct RF input signal amplification, i.e., to operate without auxiliary signal 110 as a regular PA. For example, power amplification unit 100 may have a regular mode of operation according to the prior art and an operation mode according to the disclosed invention, which are switchable according to user preferences.

Figure 2:
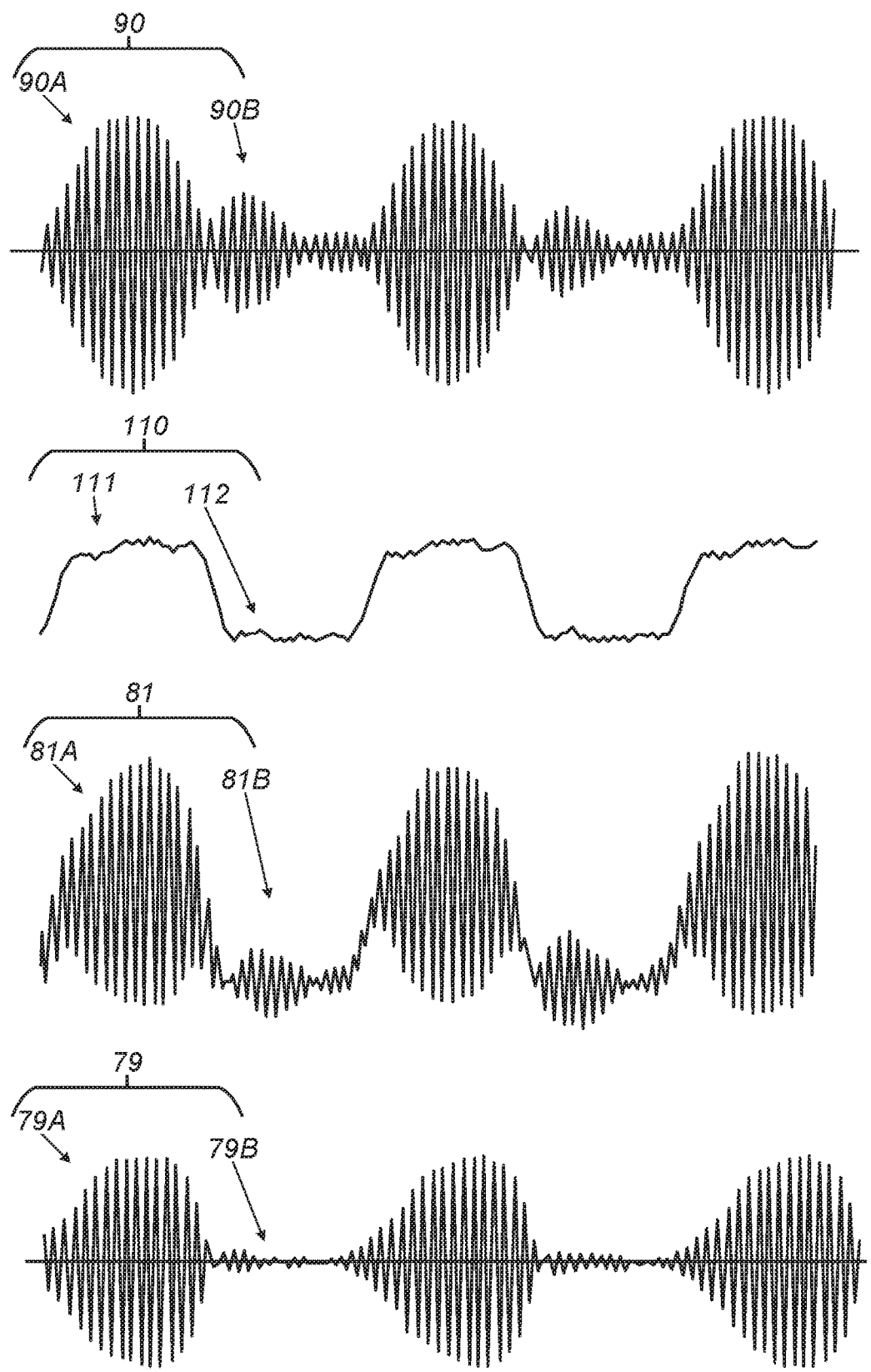
FIG. 2 schematically illustrates of exemplary signals in the power amplification unit, according to some embodiments of the invention.

FIG. 2 schematically illustrates exemplary signals in power amplification unit 100, according to some embodiments of the invention. FIG. 2 illustrates non-limiting examples of RF signal 90, auxiliary signal 110, PA RF input 81 combined by combiner 120 from RF signal 90 and auxiliary signal 110, and RF output 79 (using the MMIC distributed PA HMC797L5 with DC-22 GHz operation frequency range as the PA 80 and an L-C output matching circuit 86). RF signal 90 is depicted as having pulses 90A and quiet periods 90B (alternating at PRF) and auxiliary signal 110 is depicted as having corresponding pulse-shaped component 111 (e.g., RF signal envelope) and quiet period component 112 (e.g., approximately DC, due to implementation factors). Combiner 120 generates PA RF input 81 from RF signal 90 and auxiliary signal 110 with corresponding signal periods 81A and quiet periods 81B. Due to this configuration of PA RF input 81, PA 80 amplifies only input signal periods 81A to yield output signal periods 79A and not amplifying input quiet periods 81B to yield output quiet periods 79B. As illustrated in FIG. 2, the power consumption of PA 80 is reduced and RF output 79 is cleaner than RF signal 90.

In certain embodiments, power amplification unit 100 may be configured as an UWB transmitter comprising an UWB power amplifier which includes UWB integrated PA 80 having control and supply voltages 82 ensuring PA DC biasing, as well as a PA RF input 81 for receiving of RF signal 90 and output matching circuit 86 configured to pass with minimum loss only an amplified RF signal (from PA output 78) from UWB integrated PA 80 to a RF output 79. Power amplification unit 100 may further comprise combiner 120 (e.g., a duplexer or a multiplexer) configured to combine RF signal 90 and auxiliary signal 110, through respective high frequency filter 121 and low frequency filter 122 and to deliver the combined signal to PA RF input 81. Power amplification unit 100 may further comprise signal generator 130, which comprises RF signal generator 132 having digital data input 71 and auxiliary signal generator 134 interfaced with RF signal generator 132. RF signal generator 132 may be configured to deliver desired RF pulses as RF signal 90 and auxiliary generator 134 may be configured to generate auxiliary pulses as auxiliary signal 110, which is synchronized with envelope 91 of RF pulses signal 90. The amplitude and the duration of the auxiliary pulses may be selected to switch UWB PA 80 on during the RF pulses and to switch UWB PA 80 off during the quiet time slot between the RF pulses.

In certain embodiments, power amplification unit 100 may be configured as an UWB transmitter comprising signal generator 130, which includes RF signal generator 132 having digital data input 71 and auxiliary signal generator 134 interfaced with RF signal generator 132. RF signal generator 132 may be configured to deliver RF signal 90 and auxiliary generator 134 may be configured to generate auxiliary signal 110, which is synchronized with envelope 91 of desired RF pulses signal 90, as explained above. Output matching circuit 86 may be configured to pass with minimum loss only the output RF signal from UWB integrated PA 80 to RF output 79. Auxiliary generator 134 may be configured to receive RF input signal 90 and generate axillary signal 110 therefrom using envelope detector 134A.

Figure 3:
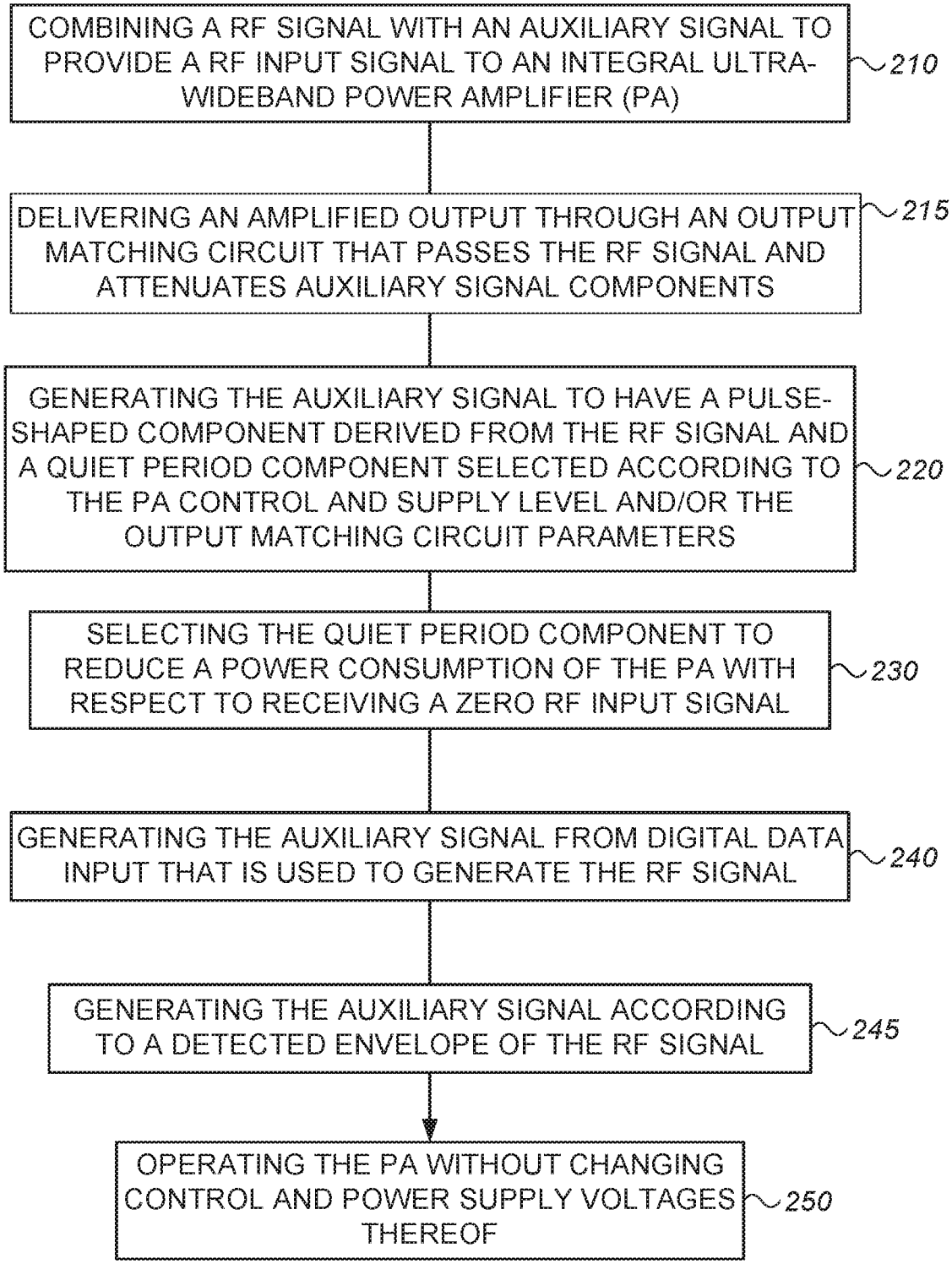
FIG. 3 is a high level flowchart illustrating a method, according to some embodiments of the invention.

FIG. 3 is a high level flowchart illustrating a method 200, according to some embodiments of the invention. These method stages are described in more detail with respect to power amplification unit 100 described above and optionally configured to implement method 200. Method 200 comprises combining (e.g., duplexing) an RF signal with an auxiliary signal to provide an RF input signal to an ultra-wideband power amplifier (stage 210), wherein the auxiliary signal is generated to have a pulse-shaped component derived from the RF signal and a quiet period component. Method 200 further comprises delivering an amplified output from the integral ultra-wideband PA through an output matching circuit having signal filtering parameters selected to pass the amplified output above a cutoff RF frequency (stage 215). The cutoff RF frequency is set to be lower than the frequency of the RF signal and higher than the frequency spectrum of the auxiliary signal. Method 200 further comprises generating the auxiliary signal to have a pulse-shaped component derived from the RF signal (e.g., its envelope or modified envelope) and a quiet period component (e.g., a DC level) selected according to the PA control and supply level and/or the output matching circuit parameters (stage 220).

Method 200 may further comprise selecting the signal filtering parameters to attenuate the auxiliary signal in the amplified output (stage 215). The cutoff RF frequency may be set according to any specifications of the PA, the RF signal and the auxiliary signal, e.g., anywhere between 300

MHz, 500 MHz and 2 GHz, 3 GHz or beyond. For example, if the 1/τ is around 500 MHz (corresponding pulse duration of 2 ns) and the RF signal is at 4 GHz, the cutoff RF frequency may be set between theses frequencies.

Method 200 may further comprise operating the PA without changing control and power supply voltages thereof (stage 250), with the quiet period component (e.g., a DC or a low frequency level) of the auxiliary signal selected to reduce a power consumption of the PA with respect to a power consumption thereof when receiving a zero RF input signal (stage 230). The pulse-shaped component may be optimized for spectrum mask quality and EVM quality of the amplified output with respect to a PA power consumption.

Method 200 may further comprise generating the auxiliary signal from digital data input that is used to generate the RF signal as well (stage 240) and/or generating the auxiliary signal according to a detected envelope of the RF signal (stage 250).

Auxiliary signal 110 which is fed into PA 80 may be synchronized with envelope 91 of desired RF pulses signal 90. Auxiliary signal 110 may be configured to open PA 80 during the RF pulses, and close PA 80 during the quiet time slot between the RF pulses by providing quiet period component 112 which removes PA 80 from its amplification working point and/or is not amplified by PA 80 due to the configuration of the output matching circuit. When PA 80 is closed or inoperative, its power consumption is significantly decreased. Power saving is enhanced as the RF signal's duty cycle is decreased, and further contributed to enhanced reliability of PA 80. Moreover, the PA may be operated at a higher gain than in the prior art, as heating is avoided between actual RF pulses.

Auxiliary signal generator 130 may be configured to avoid providing auxiliary signal 110 and/or to modify parameters of auxiliary signal 110 according to different operation schemes. Power amplification unit 100 and method 200 were tested experimentally using a distributed PA (HMC797L5) operating in the frequency range of DC to 22 GHz and RF pulses having a center frequency of 4.02 GHz, pulse rate of 125 MHz, pulse duration of about 2 ns, peak to average power ratio (PAPR) of about 6 dB, a RMS (root mean square) channel power at 500 M BW of RF signal was varied from 11.3 dBm to 13.5 dBm. A simple combiner (IL—insertion loss≤1 dB) was used for simultaneous feeding of RF and auxiliary signal to PA RF input 81. Power amplification unit 100 and method 200 achieved total power consumption reduction (including power needed for production of the axillary signal) by 30-40%. The total power consumption was reduced by 1.15 W for 23.8 dBm RMS channel power, and by 1.35 W for 22.4 dBm RMS channel power. The influence of the auxiliary signal on signal parameters was minimal—PAPR increased by 0.3-1 dB, weak improvement of Error Vector Magnitude (EVM) (~1 dB) and weak adjacent channel power ratio (ACPR) degradation (~1-3 dB) were measured.

Advantageously, power amplification unit 100 and method 200 provide significant PA improvement that reduces PA power consumption; provide fast control of PA power consumption while not or weakly influencing the PA output signal quality; and can be implemented by simple means and at low cost. In particular, in battery operated PA applications, power amplification unit 100 and method 200 may enable significant increases in battery utilization time, particularly when the RF signal's duty cycle is low.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A power amplification unit comprising:
    an integral ultra-wideband (UWB) power amplifier (PA) having an RF (radio frequency) input for receiving an RF input signal, a PA output for providing an amplified output, the UWB PA operated by control and power supply voltages,
    a combiner configured to receive an RF signal and an auxiliary signal and to generate therefrom, the RF input signal to the UWB PA,
    a signal generator configured to generate the auxiliary signal having a pulse-shaped component derived from the RF signal and a quiet period component, the auxiliary signal having a frequency spectrum lower than a cutoff RF frequency, and
    an output matching circuit connected to the PA output and having signal filtering parameters selected to pass the amplified output above the cutoff RF frequency which is lower than a frequency of the RF signal.

2. The power amplification unit of claim 1, wherein the combiner is configured to generate the RF input signal to the UWB PA through at least one filter thereof.

3. The power amplification unit of claim 1, wherein the combiner is configured to generate the RF input signal to the UWB PA through at least two filters thereof, which correspond to frequency ranges of the RF signal and the auxiliary signal, respectively.

4. The power amplification unit of claim 1, further comprising at least one filter connected at one or more inputs of the combiner.

5. The power amplification unit of claim 1, further comprising at least two filters connected at one or more inputs of the combiner and corresponding to frequency ranges of the RF signal and the auxiliary signal, respectively.

6. The power amplification unit of claim 1, further configured to be switchable into an operation mode of direct RF input signal amplification.

7. The power amplification unit of claim 1, wherein the UWB PA is operated without changing the control and power supply voltages.

8. The power amplification unit of claim 1, wherein the pulse-shaped component is related to an envelope of the RF signal.

9. The power amplification unit of claim 1, wherein the pulse-shaped component is optimized for spectrum mask quality and Error Vector Magnitude (EVM) quality of the amplified output with respect to a PA power consumption.

10. The power amplification unit of claim 1, wherein the quiet period component of the auxiliary signal is selected to reduce a power consumption of the UWB PA with respect to a power consumption thereof when receiving a zero RF input signal.

11. The power amplification unit of claim 1, wherein the signal generator is configured to receive digital data input and to generate therefrom the RF signal and the auxiliary signal.

12. The power amplification unit of claim 1, wherein the signal generator further comprises an envelope detector configured to detect an envelope of the RF signal and generate the corresponding pulse-shaped component of the auxiliary signal therefrom.

13. The power amplification unit of claim 1, wherein the combiner comprises a duplexer having a high pass filter and a low pass filter.

14. The power amplification unit of claim 1, wherein the at least two filters of the combiner comprise at least one band pass filter.

15. The power amplification unit of claim 1, wherein the output matching circuit comprises a band-stop filter configured to attenuate the auxiliary signal in the amplified output signal.

16. The power amplification unit of claim 1, wherein the cutoff RF frequency is set between 300 MHz and 3 GHz.

17. A method comprising:
combining an RF signal with an auxiliary signal to provide an RF input signal to an integral UWB PA, wherein the auxiliary signal is generated having a pulse-shaped component derived from the RF signal and a quiet period component, and
delivering an amplified output from the UWB PA through an output matching circuit having signal filtering parameters selected to pass the amplified output above a cutoff RF frequency, wherein the cutoff RF frequency is lower than a frequency of the RF signal and the auxiliary signal is configured to have a frequency spectrum lower than the cutoff RF frequency.

18. The method of claim 17, further comprising operating the UWB PA without changing control and power supply voltages thereof, with the quiet period component of the auxiliary signal selected to reduce a power consumption of the UWB PA with respect to a power consumption thereof when receiving a zero RF input signal.

19. The method of claim 17, wherein the pulse-shaped component is related to an envelope of the RF signal.

20. The method of claim 17, further comprising optimizing the pulse-shaped component for spectrum mask quality and EVM quality of the amplified output with respect to a PA power consumption.

\* \* \* \* \*